United States Patent [19]
Gotoh

[11] Patent Number: 5,467,015
[45] Date of Patent: Nov. 14, 1995

[54] SUPERCONDUCTING MAGNETOMETER HAVING INCREASED BIAS CURRENT TOLERANCE AND PRODUCING DIGITAL OUTPUT

[75] Inventor: Kohtaroh Gotoh, Kawasaki, Japan

[73] Assignee: Fujistu Limited, Kawasaki, Japan

[21] Appl. No.: 125,792

[22] Filed: Sep. 24, 1993

[30] Foreign Application Priority Data

Mar. 17, 1993 [JP] Japan .................................. 5-057525

[51] Int. Cl.⁶ ................................................. G01R 33/035
[52] U.S. Cl. ........................................... 324/248; 505/846
[58] Field of Search ........................... 324/244, 248, 324/301; 307/245, 306; 505/841, 842, 843, 845, 846, 702, 860–861

[56] References Cited

U.S. PATENT DOCUMENTS

| | | | |
|---|---|---|---|
| 4,866,373 | 9/1989 | Harada et al. | 505/845 X |
| 4,947,118 | 8/1990 | Fujimaki | 324/248 |
| 5,065,096 | 11/1991 | Muck et al. | 505/846 X |
| 5,093,618 | 3/1992 | Goto et al. | 324/248 |
| 5,155,434 | 10/1992 | Fujimaki | 324/248 |
| 5,162,731 | 11/1992 | Fujimaki | 324/248 |
| 5,287,057 | 2/1994 | Gotoh | 324/248 |
| 5,287,058 | 2/1994 | Goto et al. | 324/248 |

FOREIGN PATENT DOCUMENTS

| | | | |
|---|---|---|---|
| 0435651 | 7/1991 | European Pat. Off. | 324/248 |
| 0448368 | 9/1991 | European Pat. Off. | |
| 0461742 | 12/1991 | European Pat. Off. | |
| 0535263 | 4/1993 | European Pat. Off. | |
| 4010973 | 10/1990 | Germany. | |
| 4-204278 | 7/1992 | Japan. | |

OTHER PUBLICATIONS

Fujimaki et al., "Thermal noise–limied sensitivity of the pulse–biased SQUID magnetometer," *Journal of Applied Physics*, vol. 65, No. 4, Feb. 1989, New York, US, pp. 1626–1630.

Fujimaki, "Josephson Integrated Circuits III—A Single–Chip SQUID Magnetometer", *Fujitsu Scientific & Technical Journal*, vol. 27, No. 1, 1991, Kawasaki, JP, pp. 59–83.

Goto et al., "Multi–Channel SQUID Magnetic Meter," English language abstract of Japanese Laid–Open Patent Publication 4–204278, Jul. 24, 1992 (Appln. No. 2–336401 filed Nov. 30, 1990).

Fujimaki et al., "A Single–Chip SQUID magnetometer," *IEEE Transactions on Electron Devices*, vol. 35, No. 12, Dec. 1988, pp. 2412–2417.

*Primary Examiner*—Sandra L. O'Shea
*Assistant Examiner*—J. M. Patidar
*Attorney, Agent, or Firm*—Staas & Halsey

[57] ABSTRACT

A superconducting magnetic sensor includes a SQUID for interlinking with an external magnetic flux, an A.C. bias circuit for driving the SQUID with an A.C. bias current having a first frequency, a feedback circuit supplied with output voltage pulses from the SQUID for calculating a difference between the total number of positive output voltage pulses and the total number of negative output voltage pulses and for producing a feedback magnetic flux in response thereto such that the external magnetic flux is canceled out by the feedback magnetic flux, and a modulation current source for supplying a modulation current having a frequency substantially smaller than the frequency of the bias current and for producing a modulation magnetic flux in response to the modulation current such that the modulation magnetic flux interlinks with the SQUID.

11 Claims, 10 Drawing Sheets

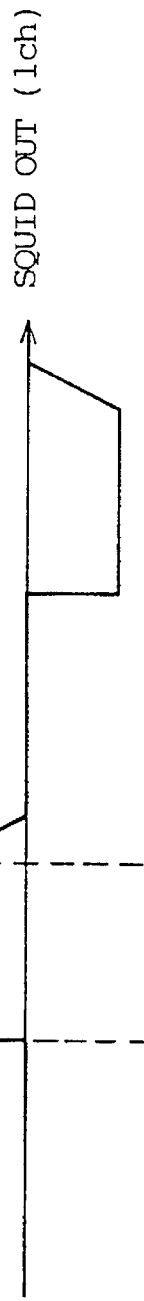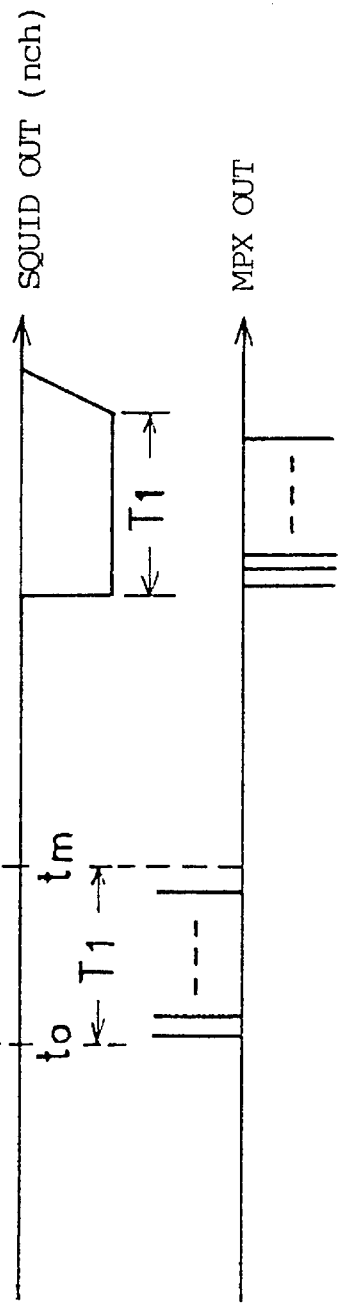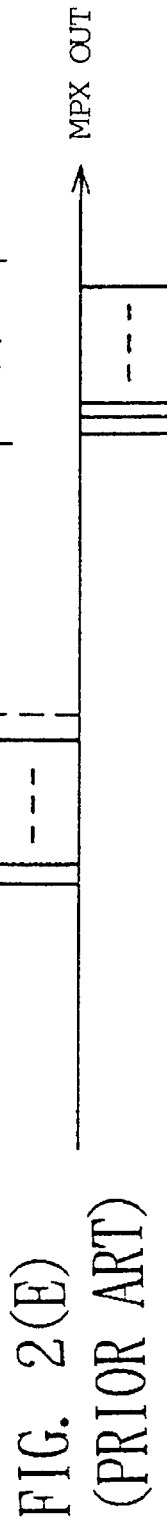
FIG. 2(A) (PRIOR ART)
FIG. 2(B) (PRIOR ART)
FIG. 2(C) (PRIOR ART)
FIG. 2(D) (PRIOR ART)
FIG. 2(E) (PRIOR ART)

SUPERCONDUCTING MAGNETOMETER HAVING INCREASED BIAS CURRENT TOLERANCE AND PRODUCING DIGITAL OUTPUT

BACKGROUND OF THE INVENTION

The present invention generally relates to superconducting circuits and more particularly to a superconducting magnetic sensor that uses a superconducting quantum interference device (SQUID).

Superconducting quantum interference devices (SQUIDs) are used for super-high sensitivity magnetometers suitable for detecting feeble magnetic fields of biological bodies such as brain or heart. In such a medical application of SQUIDs, it is desired to construct the magnetometer to have a large number of channels such that the detection of the magnetic field is achieved simultaneously in such a plurality of channels.

Conventionally, analog SQUIDs that produce an analog output voltage have been used for constructing such superhigh sensitivity magnetometers. On the other hand, a magnetometer that uses a digital SQUID has been proposed recently (Fujimaki, N. et al, "A single-chip SQUID magnetometer," *IEEE TRANSACTIONS ON ELECTRON DEVICES* vol. 35, no. 12, Dec. 1988, pp. 2412–2417), wherein the SQUID magnetometer of the reference is driven by an A.C. bias current and produces output voltage pulses in synchronization with the A.C. bias current as a result of detection of the magnetic field. It will be noted that such a digital output of the magnetometer is suitable for processing in digital circuits.

The foregoing single-chip SQUID magnetometer includes a SQUID sensor and a superconducting detection loop coupled magnetically thereto, and the SQUID sensor produces positive output voltage pulses or negative output voltage pulses depending upon the direction of an unknown magnetic field that interlinks with the superconducting detection loop. The SQUID sensor is biased by an A.C. bias current as mentioned previously and produces the foregoing output voltage pulses in synchronization to such a bias current. Further, the SQUID magnetometer includes a superconducting accumulation loop provided commonly on a chip on which the SQUID sensor is provided, wherein the superconducting accumulation loop is configured to store a flux quantum via a write gate in response to each output voltage pulse produced by the SQUID sensor. The superconducting accumulation loop further produces an analog feedback current which is fed back to the superconducting detection loop for creating a magnetic flux that counter-acts the unknown magnetic field. The measurement of the magnetic field is achieved by counting up the number of the output pulses produced by the SQUID sensor until the unknown magnetic flux is canceled out by the feedback current. The foregoing single-chip SQUID magnetometer has an advantageous feature in that the feedback circuit, formed of a superconducting circuit, is provided within the cooling vessel commonly with the SQUID sensor. Thereby, one can minimize the penetration of heat into the cooling vessel via lines connecting the SQUID sensor in the cooling vessel to external circuits.

As an alternative approach to minimize the penetration of heat into the interior of the cooling vessel, one may provide a number of SQUID sensors in a common cooling vessel and apply a multiplexing process to the output pulses of the SQUID sensors. In fact, in the field of medical applications, there is a strong demand for a multi-channel SQUID magnetometer as mentioned previously.

For example, the Japanese Patent Application 2-336401 filed Nov. 30, 1990, and laid-open on Jul. 24, 1992, as Japanease Laid-Open Patent Publication 4-204278, describes a multi-channel SQUID magnetometer wherein the output pulses of a number of SQUID sensors are multiplexed in a superconducting multiplexer such that the output pulses of the foregoing plural channels are outputted to the exterior of the cooling vessel via a single line. Such a construction of the magnetometer is effective for reducing the number of interconnections and hence the penetration of heat into the interior of the cooling vessel.

FIG. 1 shows the principle of operation of a typical SQUID sensor used in the foregoing single-chip SQUID magnetometer, wherein the SQUID sensor has a generally asymmetric threshold characteristic or flux verses critical bias current characteristic as shown in FIG. 1.

Referring to FIG. 1, the vertical axis represents the bias current $I_c$ and the horizontal axis represents the unknown magnetic flux that interlinks with the superconducting detection loop of the magnetometer, wherein the rectangular regions surrounded by a continuous line and designated as MODE1, MODE0, MODE+1, . . . , represent the region wherein the Josephson junctions that form the SQUID sensor are held in the zero-voltage state. The different modes in FIG. 7 represent different states characterized by a different number of flux quanta stored in the SQUID sensor, and in each mode, the Josephson junctions experience a transition to a finite voltage state when the operational point has escaped from the rectangular region by crossing the characteristic line.

In operation, the bias current $I_c$ is set to have a magnitude substantially equal to a critical level above which the SQUID sensor causes a transition to the finite voltage state in the absence of the external magnetic flux. Thus, the bias current $I_c$ is set to have a magnitude such that the bias current $I_c$ swings between a level $+i_{TH}$ and a level $-i_{TH}$, wherein $+i_{TH}$ and $-i_{TH}$ respectively represent the positive and negative thresholds of the transition of the SQUID sensor to the finite voltage state. Thus, as long as there is no magnetic flux $\Phi_x$ interlinking with the superconducting detection loop to which the SQUID sensor is coupled, the transition of the SQUID sensor does not occur. On the other hand, when there exists a positive magnetic flux $+\Phi_x$ as indicated in FIG. 1, the SQUID experiences a transition to the finite voltage state in response to the positive peak of the bias current $I_c$ and a positive output pulse is produced in response to such a transition. When there exists a negative magnetic flux $-\Phi_x$ as indicated also in FIG. 1, the SQUID experiences a transition to the finite voltage state in response the negative peak of the bias current $I_c$ and a negative output pulse is produced in response to such a transition.

In such a SQUID sensor, therefore, it will be noted that the polarity of the output pulse represents the direction of the magnetic flux that interlinks with the superconducting detection loop of the SQUID sensor. The SQUID sensor continues to produce the output pulses as long as there exists the magnetic flux $\Phi_x$ interlinking with the superconducting detection loop, and the magnitude of the flux $\Phi_x$ is determined by counting up the number of the output pulses while canceling out the flux $\Phi_x$ in response to each output voltage pulse as mentioned previously. When the magnetic flux $\Phi_x$ is completely canceled out, the SQUID sensor stops outputting the voltage pulses.

FIGS. 2(A)–2(E) show the operation of a multi-channel

SQUID magnetometer wherein a plurality of SQUID sensors each having a characteristic of FIG. 1 are provided in a cooling vessel in correspondence to a plurality of channels, wherein FIG. 2(A) shows the waveform of the A.C. bias current $I_c$ used for driving the SQUID sensors, while FIGS. 2(B)–2(D) show the waveform of the output voltage pulses produced by the SQUID sensors in response to the transition to the finite voltage state. As will be noted, the SQUID sensors produce positive or negative output pulses in response to the direction or polarity of the magnetic flux $\Phi_x$ and the output pulses of FIGS. 2(B)–2(D) are multiplexed into a single output signal shown in FIG. 2(E).

When constructing such a multi-channel magnetometer, it is necessary to set the magnitude of the bias current $I_c$ to be equal to the threshold level $i_{TH}$ as mentioned previously for each of the SQUID sensors, wherein such an adjustment of the bias current $I_c$ has to be achieved with a precision of 1% or less with respect to the threshold level $i_{TH}$. Because of such a small tolerance allowed in the magnitude of the bias current $I_c$, one has to adjust the magnitude of the bias current with respect to individual SQUID sensors in the magnetometer, in view of the fact that the SQUID sensors of different channels may have the threshold levels that change device by device. However, it will be noted that such an adjustment of the bias current with respect to individual SQUID sensors makes the construction of the magnetometer extremely complex, and the construction of such a multi-channel SQUID sensor has been extremely difficult.

SUMMARY OF THE INVENTION

Accordingly, it is a general object of the present invention to provide a novel and useful superconducting magnetometer wherein the foregoing problems are eliminated.

Another and more specific object of the present invention is to provide a superconducting magnetometer wherein a large tolerance is allowed with respect to the magnitude of the A.C. bias current while maintaining a proper device operation.

Another object of the present invention is to provide a superconducting magnetometer, comprising:

a superconducting magnetic sensor for interlinking with an external magnetic flux, said superconducting magnetic sensor being supplied with a first A.C. bias current for producing output voltage pulses in response to said first A.C. bias current, said superconducting magnetic sensor having a flux versus bias current characteristic describing a relationship between a magnetic flux acting upon said superconducting magnetic sensor and said first A.C. bias current, said flux versus bias current characteristic defining a first region in which said super conducting magnetic sensor assumes a zero voltage state and a second region surrounding said first region and in which said superconducting magnetic sensor assumes a finite voltage state, said superconducting magnetic sensor producing said output voltage pulse in response to a transition from said zero voltage state to said finite voltage state;

first biasing means for supplying said first A.C. bias current;

feedback means supplied with said voltage pulses from said superconducting magnetic sensor for counting up the number of said voltage pulses, said feedback means further producing a feedback current in response to the number of said voltage pulses;

first superconducting magnetic coupling means coupled magnetically to said superconducting magnetic sensor, said first superconducting magnetic coupling means being supplied with said feedback current from said feedback means for producing a counter-acting magnetic flux in response to said feedback current, said superconducting magnetic coupling means coupling said counter-acting magnetic flux to said superconducting magnetic sensor;

second biasing means for producing a second A.C. bias current; and second superconducting magnetic coupling means coupled magnetically to said superconducting magnetic sensor, said second superconducting magnetic coupling means being supplied with said second A.C. bias current from said second biasing means for producing a modulation magnetic flux in response to said second A.C. bias current, said second superconducting magnetic coupling means coupling said modulation magnetic flux to said superconducting magnetic sensor.

According to the present invention, one can increase the margin of tolerance of the first A.C. bias current substantially as a result of the coupling of the modulation magnetic flux that causes an operational point of said superconducting magnetic sensor to move alternately in a positive direction and a negative direction on an axis representing said magnetic flux in said flux versus bias current characteristic, wherein the frequency of said second A.C. bias current is set substantially smaller than the frequency of said first A.C. bias current. Typically, said second A.C. bias current has a frequency that is smaller than said first A.C. bias current by a factor of one hundred to one thousand. When the superconducting magnetic sensor is biased as such, the magnetic sensor produces positive and negative output voltage pulses by causing a transition to the finite voltage state even when the first A.C. bias current has a magnitude set smaller than a threshold level of the transition. In such a case, the positive and negative voltage pulses are produced with the same number when there is no interlinking external magnetic flux, while when such an external magnetic flux exists, the number of the positive output voltage pulses increases or decreases with respect to the number of the negative output pulses, depending upon the direction of the external magnetic flux. Thus, by counting up the total number of the output voltage pulses, one can detect the direction as well as the magnitude of the external magnetic flux.

Other objects and further features of the present invention will become apparent from the following detailed description when read in conjunction with the attached drawings.

BRIEF DESCRIPTION OF THE DRAWINGS

FIGS. 2(A)–2(E) are diagrams showing the waveform of signals produced in a multichannel SQUID magnetometer that uses the SQUID magnetic sensor of FIG. 1;

DETAILED DESCRIPTION OF THE PREFERRED EMBODIMENTS

Figure 3:
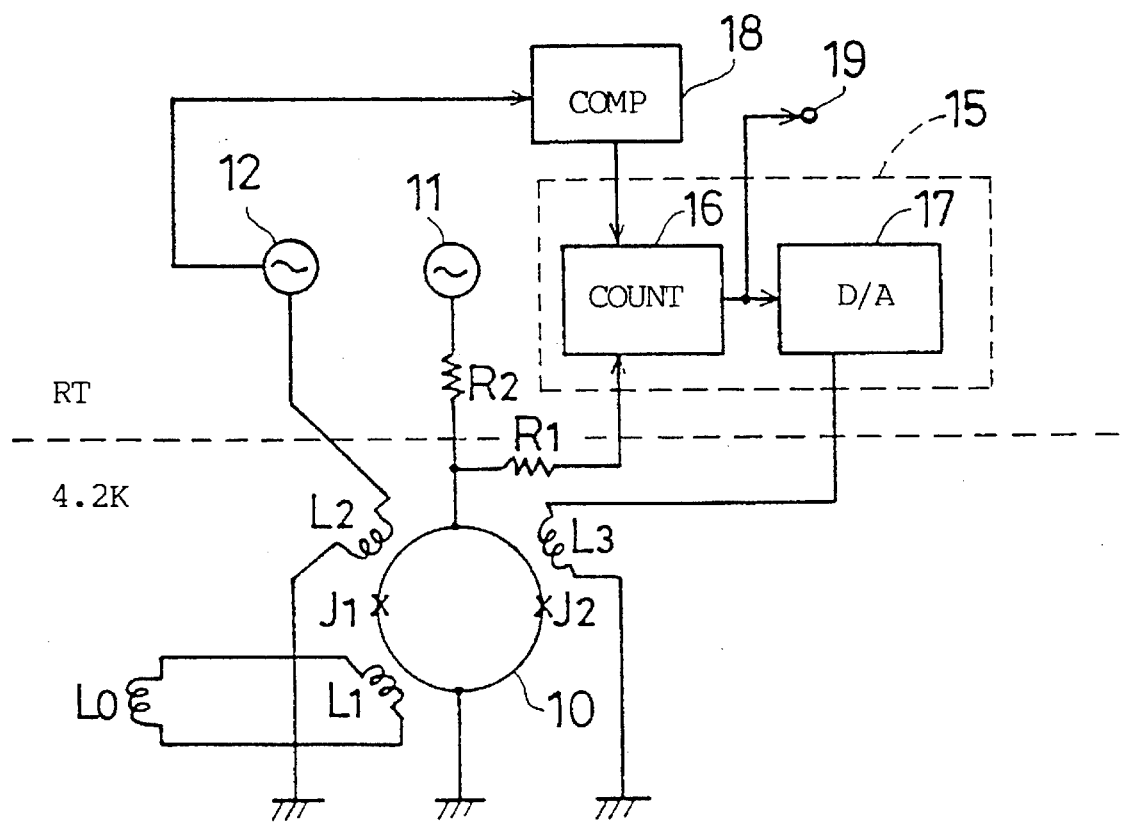
FIG. 3 is a diagram showing the construction of a SQUID magnetometer according to a first embodiment of the present invention.

FIG. 3 shows a first embodiment of the SQUID magnetic sensor according to a first embodiment of the present invention.

Referring to FIG. 3 showing a SQUID 10 according to the first embodiment, the SQUID sensor 10 includes a pair of Josephson junctions $J_1$ and $J_2$ connected with each other by a superconducting loop. The SQUID 10 is supplied with an A.C. bias current $I_c$ from a bias current source 11 via a resistor $R_2$ as is commonly practiced in the art, and a superconducting coil $L_1$, connected to a superconducting detection coil $L_0$ by a superconducting strip, is coupled magnetically to the SQUID 10. The SQUID 10 as well as the coils $L_0$ and $L_1$ are immersed in liquid helium held in a cooling vessel shown schematically in FIG. 3 as 4.2K, wherein the coil $L_0$ is adapted to interlink with an external unknown magnetic flux $\Phi_x$. Thus, the SQUID 10 causes a transition to a finite voltage state according to the flux versus bias current characteristic shown in FIG. 1 and produces output voltage pulses indicated in FIGS. 2(A)–2(D). In the illustrated example, the output voltage pulses are supplied to a feedback control circuit 15 provided in a room temperature environment designated in FIG. 3 as RT, wherein the feedback control circuit includes an updown counter 16 for counting the number of the output pulses produced by the SQUID sensor 10. The updown counter 16 increases the number of count by one in response to a positive voltage pulse and decreases the number of the counts by one in response to a negative voltage pulse, and supplies output data indicative of the number of the counts at an output terminal 19.

The number of the counts thus obtained in the updown counter 16 is converted to an analog signal in a D/A converter 17 that is provided as a part of the feedback control circuit 15, and the analog signal thus obtained is supplied to a superconducting coil $L_3$ that is provided in the cooling vessel in magnetic coupling to the SQUID 10, as a feedback current. In response to the feedback current, the superconducting coil $L_3$ produces a feedback magnetic flux that counter-acts the external magnetic flux. The magnitude of the feedback magnetic flux increases with the number of the counts in the updown counter 16 until the external magnetic flux is totally canceled out. The operation described heretofore is common in conventional digital SQUID magnetometers described for example in the U.S. Pat. No. 5,162,731, except that the device of the present invention employs the feedback control circuit 15 provided in the room temperature environment.

In the SQUID magnetometer of FIG. 3, it should be noted that there is provided another A.C. signal source 12 that produces a modulation current, wherein the modulation current thus produced is supplied to another superconducting coil $L_2$ that is provided in the cooling vessel in magnetic coupling with the SQUID sensor 10. Typically, the modulation current has a frequency in the order of 1–10 kHz which is about one hundred to one thousand times smaller than the frequency of the bias current $I_c$. In other words, the modulation current swings far slowly as compared with the bias current $I_c$. Further, the modulation current is supplied to a comparator 18 that produces a reset signal in response to a thresholding process, and the reset signal thus produced is supplied to the up-down counter 16 for resetting the same periodically. In response to the modulation current, a modulation magnetic flux is created by the coil $L_2$ and the modulation magnetic flux thus created interlinks with the SQUID sensor 10.

Figure 4A:
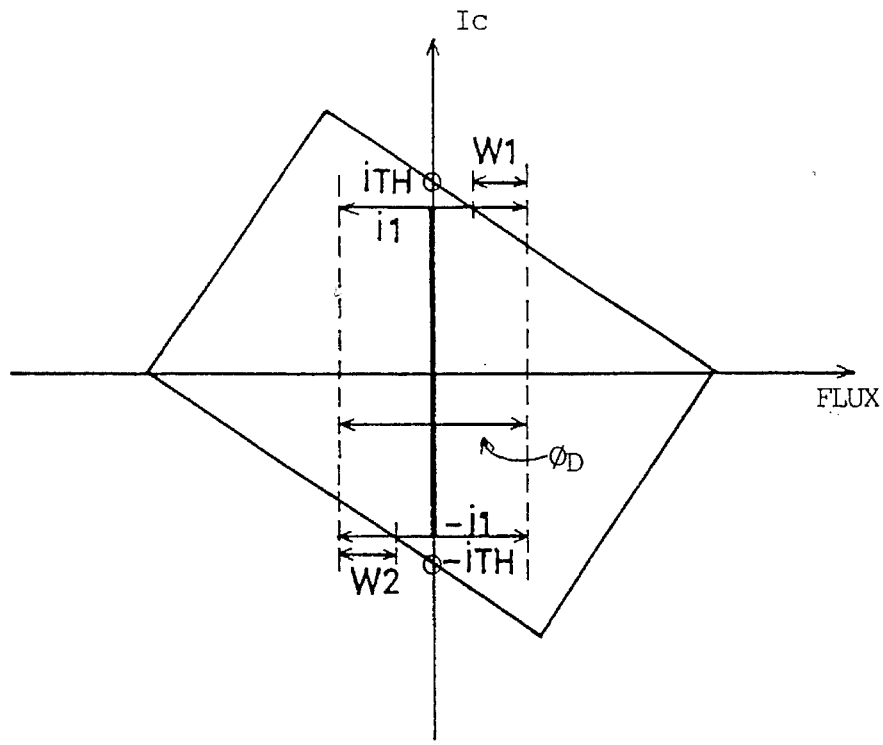
FIGS. 4(A) and 4(B) are characteristic diagrams similar to FIG. 1 and showing the essential feature of the present invention.
Figure 4B:
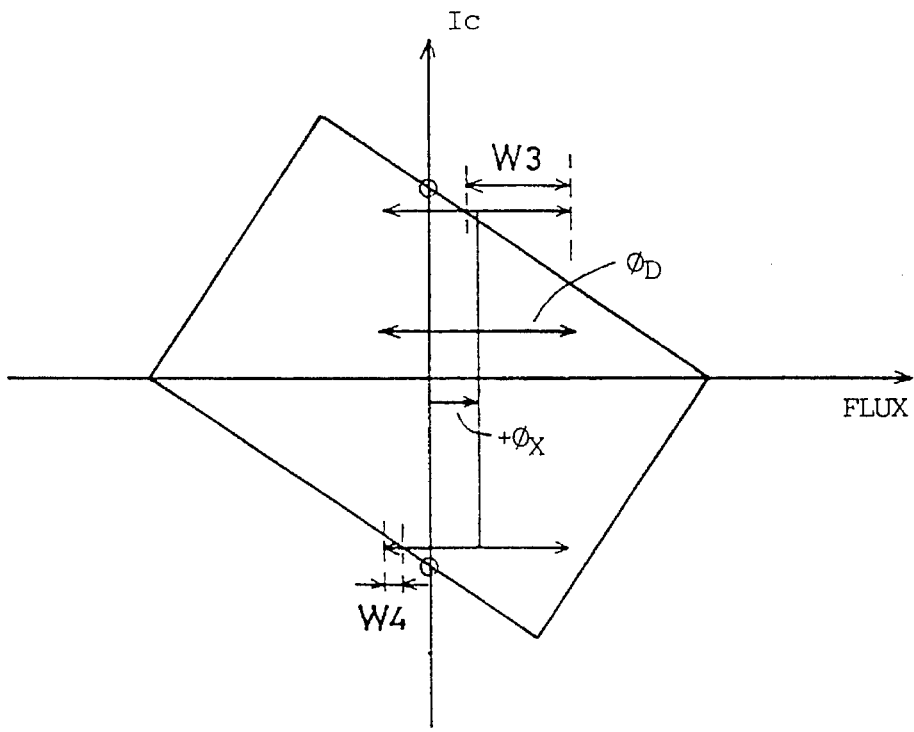

FIGS. 4(A) and 4(B) show the principle of operation of the SQUID sensor 10 of FIG. 3, wherein FIG. 4(A) shows the state wherein there is no interlinking external flux, while FIG. 4(B) shows the state wherein an external flux $\Phi_x$ is interlinking with the superconducting detection coil $L_0$. Similarly to FIG. 1, the region wherein the SQUID sensor 10 shows the zero voltage state is represented by a rectangular region defined by a pair of oblique, parallel lines and another pair of oblique parallel lines.

Referring to FIGS. 4(A) and 4(B), it will be noted that the bias current $I_c$ changes between a level $i_1$ and $i_{-1}$ with a magnitude substantially smaller than the magnitude that corresponds to the threshold levels $i_{TH}$ and $-i_{TH}$ at which the transition of the SQUID sensor 10 occurs from the zero voltage state to the finite voltage state. Thus, as long as there is no magnetic flux interlinking with the SQUID sensor 10, there occurs no transition in the SQUID sensor 10 and hence no output of the output voltage pulses. On the other hand, when there occurs an interlinking of a modulation magnetic flux $\Phi_D$ at the coil $L_0$ as a result of the modulation current, the operational point swings slowly to the right and left while moving up and down vertically in FIG. 4(A) at a high speed. Thereby, there occur a number of transitions to the finite voltage state in an interval designated as $W_1$ and positive voltage pulses are produced in response to such transitions. Similarly, in the interval designated as $W_2$, there occur also a number of transitions to the finite voltage state and negative voltage pulses are produced in response to such transitions.

In the state of FIG. 4(A), it should be noted that the interval $W_1$ and the interval $W_2$ continue for an identical duration, and the number of the positive voltage pulses and the number of the negative voltage pulses become equal to each other. When such positive and negative voltage pulses are counted in the updown counter 16, the increase of the count corresponding to the positive pulses and the decrease of the count corresponding to the negative pulses cancel with each other, and the output data of the counter 16 indicates that the number of the counts is substantially zero.

In the state of FIG. 4(B) wherein there is an unknown magnetic flux $+\Phi_x$ interlinking with the superconducting detection coil $L_0$, the operational point shifts to the right and there appears a finite voltage region $W_3$ at the upper right part of the rectangular, zero voltage region with a substantially reduced area as compared with the region $W_1$ of FIG. 4(A). On the other hand, there appears another finite voltage region $W_4$ at the lower left part of the zero voltage region with a substantially expanded area as compared with the region $W_2$. Thus, it will be noted that the duration in which the operational point dwells in the region $W_3$ is substantially longer than the duration in which the operational point dwells in the region $W_4$, and the number of the positive output voltage pulses, produced by the SQUID sensor 10 as a result of the transition into the region $W_3$, increases substantially as compared with the number of the negative output voltage pulses produced by the sensor 10 as a result of the transition into the region $W_4$. Thus, by detecting the difference between the positive voltage pulses and the negative voltage pulses in the updown counter 16, one can detect the net number of the voltage pulses corresponding to the unknown flux $\Phi_x$. The feedback control circuit 15 thereby achieves the foregoing feedback of the feedback current from the D/A converter 17 to the superconducting coil $L_3$, based upon the net number of the voltage pulses thus detected.

Figure 1:
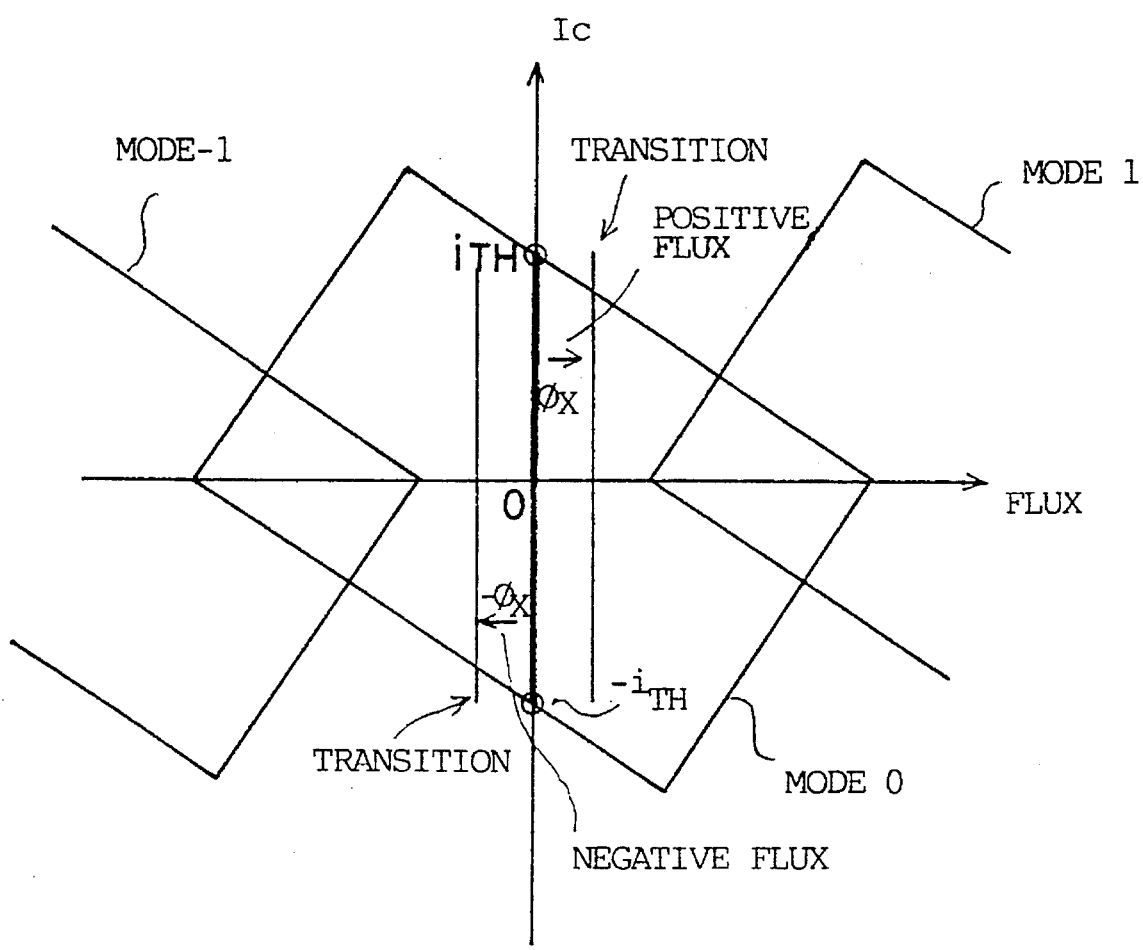
FIG. 1 is a diagram showing the operational characteristic of a SQUID magnetic sensor.

As will be understood from FIGS. 4(A) and 4(B), the SQUID sensor 10 of FIG. 1 operates properly even when the magnitude of the bias current is $I_c$ set slightly smaller than the threshold level $i_{TH}$ of the finite voltage transition of the sensor 10. As a result, the tolerance for setting the magnitude of the bias current $I_c$ increases and the construction of a multichannel SQUID magnetometer that includes a number of SQUID sensors in a common cooling vessel for magnetic detection, becomes substantially easier.

Figure 5:
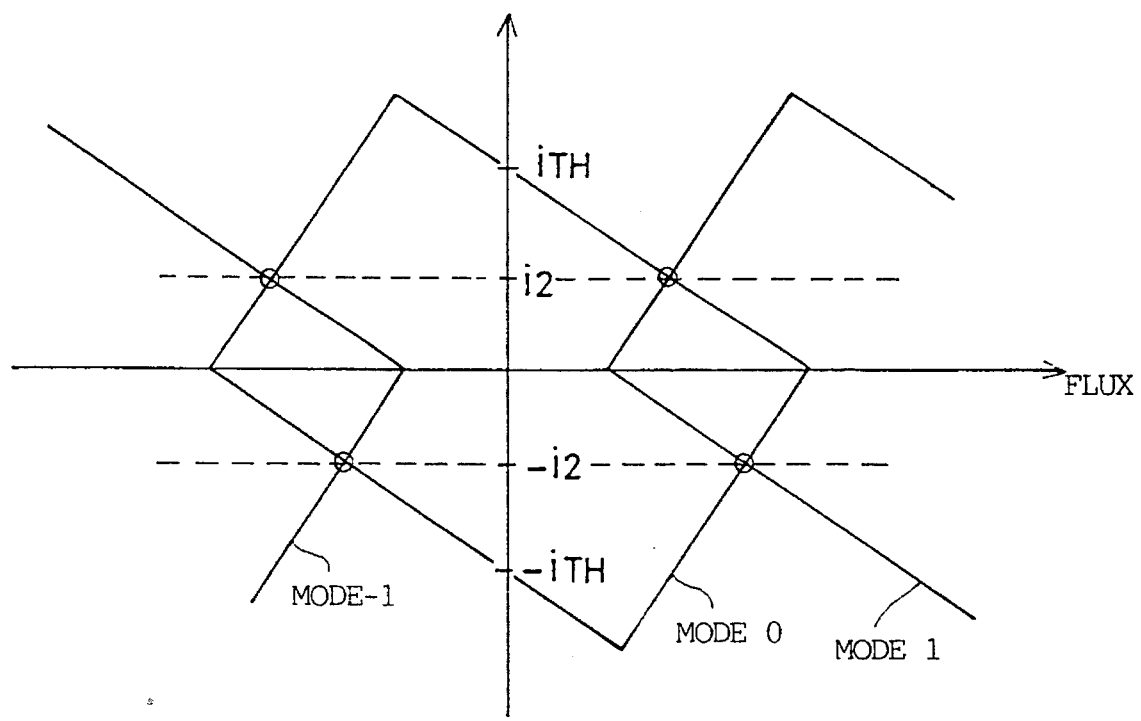
FIG. 5 is a diagram showing the limitation in setting the bias current in the present invention.

FIG. 5 shows a limiting case for setting the bias current $I_c$, wherein the bias current $I_c$ changes between a level $+i_2$ and $-i_2$, wherein the levels $+i_2$ and $-i_2$ are set coincident to the cross point of the characteristic curves that define the boundary of the zero-voltage state between two adjacent modes such as MODE-1, MODE0, MODE+1, . . . . It should be noted that the MODE-1, MODE0, MODE+1, . . . differ with each other by the number of flux quanta stored therein. When the magnitude of the bias current $I_c$ is smaller than the foregoing levels, the transition to the finite voltage state does not occur. Thus, one has to set the magnitude of the bias current $I_c$ to be at least equal to or larger than the foregoing levels $+i_2$ and $-i_2$.

Figure 6:
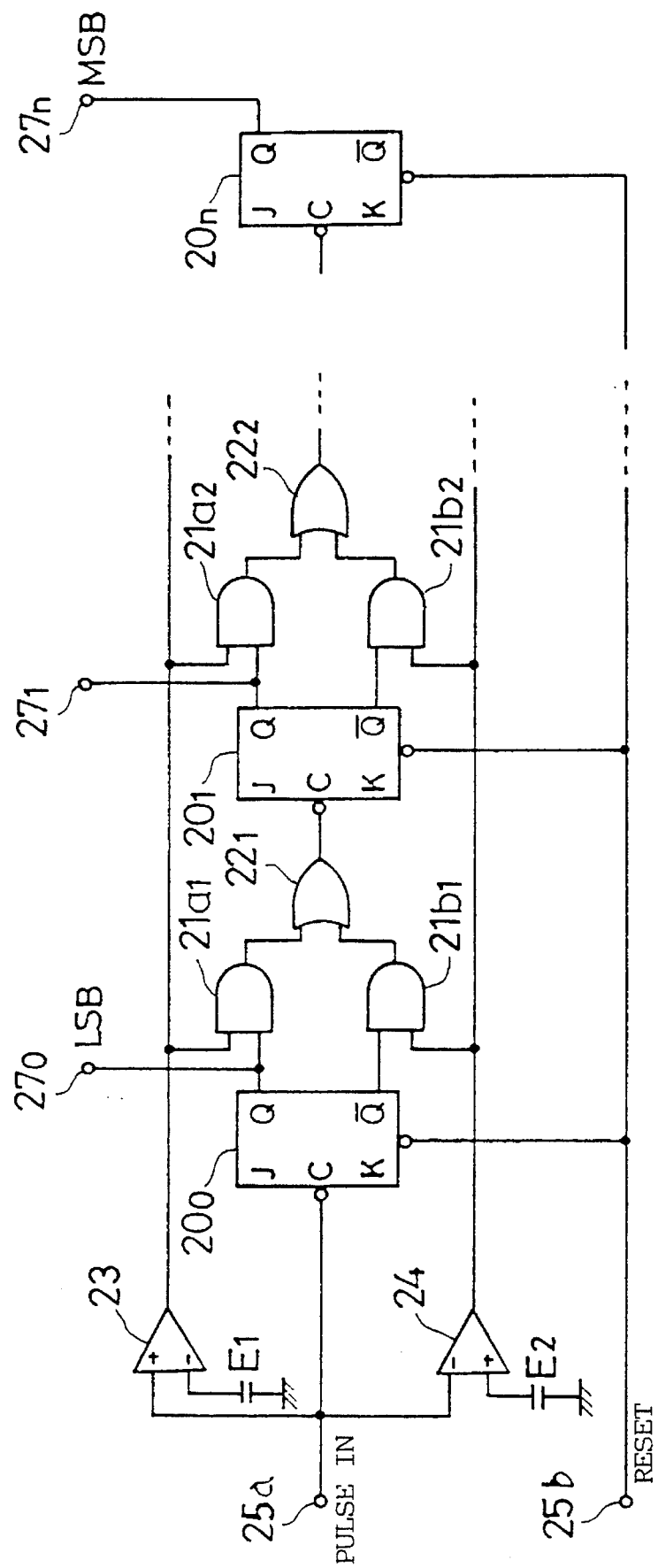
FIG. 6 is a diagram showing the construction of an updown counter used in the magnetometer of FIG. 3.

FIG. 6 shows the construction of the feedback control circuit 15 of FIG. 1, wherein the feedback control circuit 15 is subjected to a resetting in response to the modulation signal from the A.C. signal source 12 as described previously, wherein the reset signal for resetting the updown counter 16 of the feedback control circuit 15 is produced in the comparator 18 in response to the modulation signal. Thus, when the level of the modulation signal has exceeded a predetermined threshold, the reset signal is supplied to the updown counter 16 and the updown counter 16 starts counting the number of the output voltage pulses of the SQUID sensor 10, wherein the updown counter 16 is reset periodically with the cycle of the modulation signal produced by the A.C. signal source 12.

Referring to FIG. 6 showing the construction of the updown counter 16, the updown counter 16 is constructed based upon a semiconductor circuit and includes JK flip-flops $20_0$–$20_n$, AND gates $21a_1$–$21a_n$, $21b_1$–$21b_n$, OR gates $22_1$–$22_n$, and comparators 23 and 24. It will be noted that the updown counter 16 has an input terminal 25a to which the output voltage pulses of the SQUID sensor 10 are supplied. The output voltage pulses are further supplied to the comparator 23 that compares the level of the foregoing output voltage pulses with a first, positive reference voltage $E_1$ that has a magnitude set to one half the peak level of the output voltage pulses, and the comparator 23 produces an up-count control signal when a positive output voltage pulse is supplied to the terminal 25a. The up-count control signal thus produced is supplied to the AND gates $21a_1$–$21a_n$. On the other hand, the comparator 24 is supplied with the output voltage pulses of the SQUID sensor 10 and applies a thresholding process by comparing the level of the output voltage pulses with a second, negative reference voltage $E_2$ that has a magnitude set to one half the peak level of the output voltage pulses, and the comparator 24 produces a down-count control signal when a negative output voltage pulse is supplied to the terminal 25a. Thereby, the down-count control signal thus produced is supplied to the AND gates $21b_1$–$21b_n$.

Each of the JK flip-flops $20_0$–$20_n$ experiences a resetting in response to the reset signal supplied to an input terminal 25b. Further, the flip-flop $20_0$ is supplied with the voltage pulses from the input terminal 25a at a clock input terminal C and produces an output as well as an inverted output respectively at a Q output terminal and a /Q output terminal. The output as well as the inverted output of the flip-flop $20_0$ are supplied respectively to the AND gates $21a_1$ and $21b_1$ of the next stage, wherein the AND gate $21a_1$ selects the output of the Q terminal in response to the high level state of the up-count control signal from the comparator 23. When the down-count control signal from the comparator 24 has a high level, on the other hand, the inverted output at the /Q terminal is selected by the AND gate $21b_1$. The output thus selected is supplied to the flip-flop $20_1$ of the next stage via the OR gate $22_1$. Further, the foregoing construction is repeated a number of times. Thereby, the result of the counting is obtained in the form of n+1 bit data at the output terminals $27_0$–$27_n$ respectively connected to the Q terminals of the flip-flops $20_0$–$20_n$.

Figure 7:
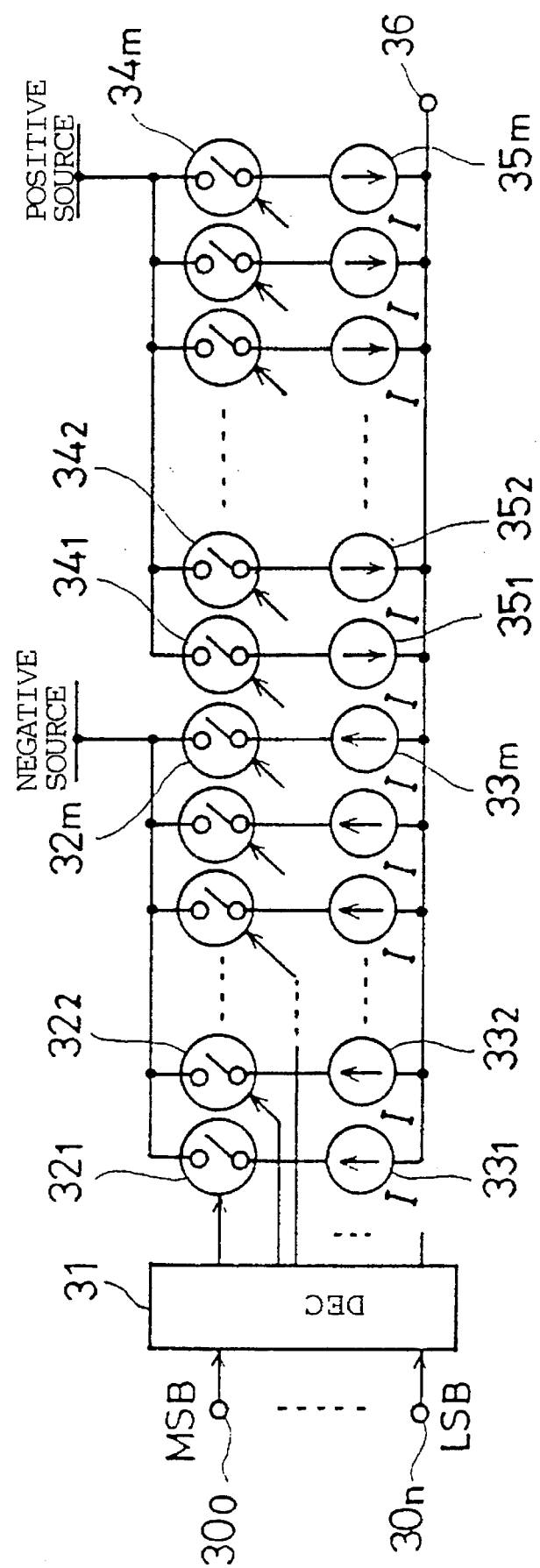
FIG. 7 is a diagram showing the construction of a D/A converter used in the magnetometer of FIG. 3.

FIG. 7 shows the construction of the D/A converter 17 in the form of a block diagram.

Referring to FIG. 7, the D/A converter 17 has a number of terminals $30_0$–$30_n$ to which the n+1 bit data of the updown counter 16 is supplied. The n+1 bit data thus supplied is further forwarded to a decoder 31 for decoding, wherein the decoder 31 decodes the number of the counts given from the updown counter 16 in the form of the n+1 bit binary digits and activates switches $32_1$–$32_m$ connected thereto when the number of the counts has a negative value. When the number of the counts is positive, on the other hand, the decoder 31 activates switches $34_1$–$34_m$ connected also thereto. The switches $32_1$–$32_m$ and $34_1$–$34_m$ are connected to corresponding current sources $33_1$–$33_m$ and $35_1$–$35_m$ respectively, wherein each of the current sources $32_1$–$32_m$ and $35_1$–$35_m$ produces a unit current I. Thus, upon activation of the switches $32_1$–$32_m$ and $34_1$–$34_m$ in response to the output of the updown counter 16, the selected current sources supply the output current to an output terminal 36 that is connected to the superconducting coil $L_3$. It should be noted thereby that the output current supplied to the coil $L_3$ via the output terminal 36 has a magnitude indicative of the number of the counts of the voltage pulses of the SQUID sensor 10 detected in the updown counter 16.

Figure 8:
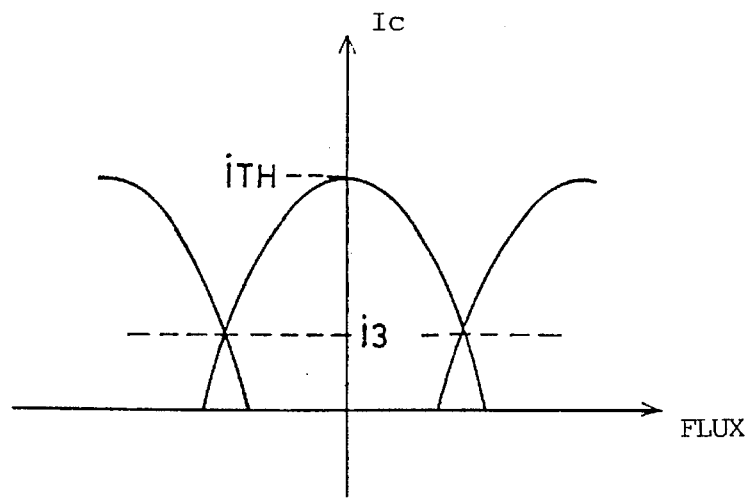
FIG. 8 is a diagram showing another characteristic diagram corresponding to a modification of the SQUID magnetometer of FIG. 3.

In the case when the SQUID sensor 10 has a symmetric threshold characteristic as shown in FIG. 8 with respect to the interlinking magnetic flux, the switching of the SQUID sensor occurs only in the positive polarity of the bias current. In such a case, the bias current is set to have a magnitude smaller than the threshold level $i_{TH}$ but larger than a level $i_3$, wherein the level $i_3$ is set in correspondence to the cross point of the characteristic curves for different modes. Thereby, the A.C. bias current swings between the zero current level and a level located between $i_{TH}$ and $i_3$. In this case, too, one can use an arbitrarily set magnitude for the bias current $I_c$, as a result of use of the modulation signal produced by the A.C. current source 12. In order to achieve the foregoing swinging of the operational point, the bias current $I_c$ is applied with a D.C. offset.

When using a SQUID sensor having the characteristic shown in FIG. 8, the comparators 23 and 24 in the updown counter 16 are eliminated and the up-count control signal is given by the reset signal supplied to the terminal 25b in response to the modulation signal, while the down-count control signal is given by the inversion of the reset signal. It should be noted that the reset signal assumes a positive polarity when in the positive cycle of the modulation signal and a negative polarity when in the negative cycle of the modulation signal. As the construction of the updown counter 16 for use in such a modification is obvious from the foregoing description, further description of the same with reference to drawings will be omitted.

Figure 9:
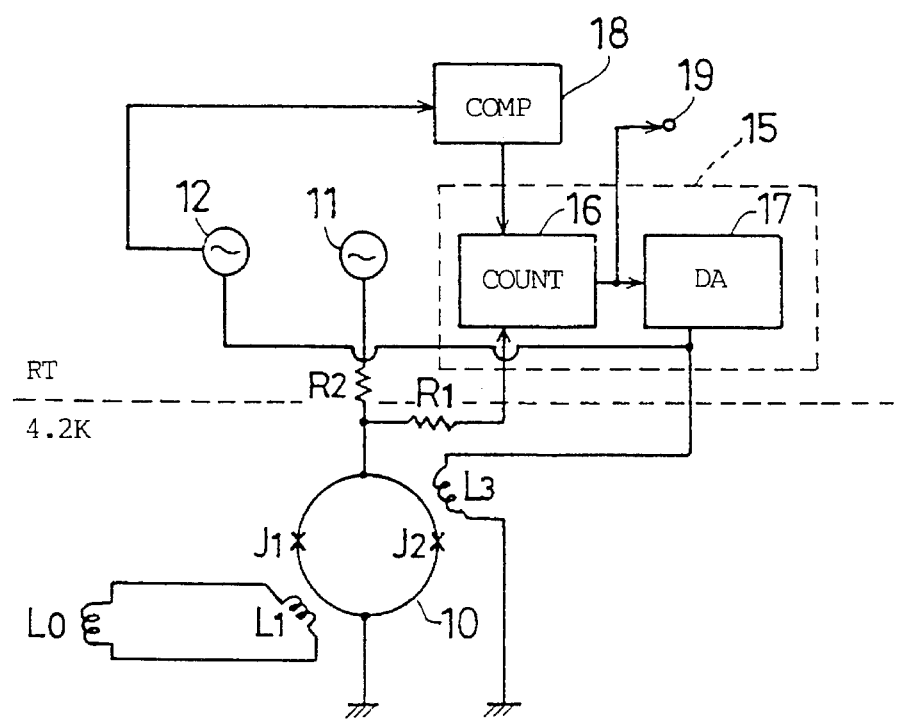
FIG. 9 is a diagram showing the construction of a modification of the SQUID magnetometer of FIG. 3.

FIG. 9 shows another modification of the SQUID magnetometer of FIG. 3. In FIG. 9, those parts common to the parts in FIG. 7 are designated by the same reference numerals and the description will be omitted. In the present modification, the modulation signal is superposed to the feedback current and supplied to the superconducting coil $L_3$ together. In such a construction, it will be noted that one can eliminate the superconducting coil $L_2$ and hence a superconducting line connected thereto. As the number of the lines that penetrates through the cooling vessel can be reduced by constructing the magnetic sensor as such, the penetration of heat and hence the loss of the coolant is minimized.

Figure 10:
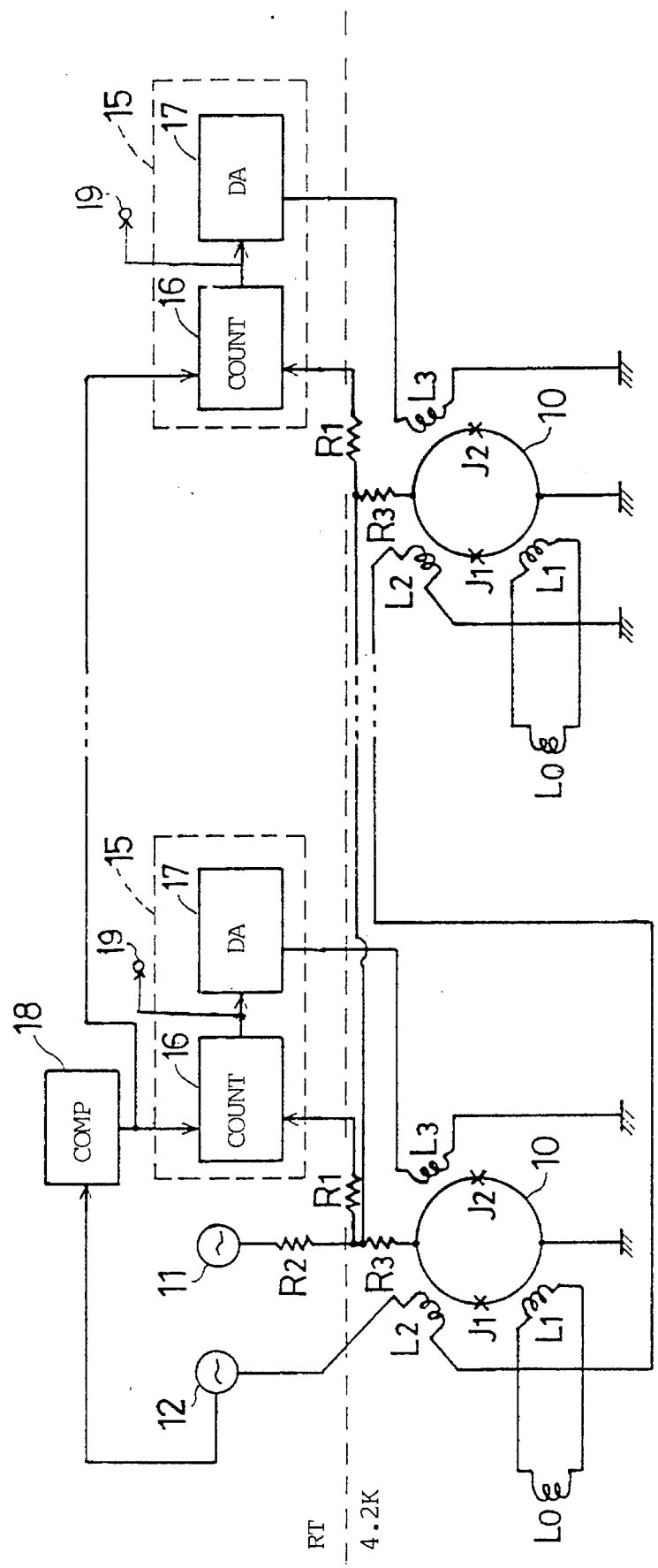
FIG. 10 is a diagram showing the construction of a multichannel SQUID magnetometer according to a second embodiment of the present invention.

FIG. 10 shows the construction of a multichannel SQUID magnetometer constructed by using the SQUID sensor 10 of FIG. 3 for each of the channels. In FIG. 10, therefore, those parts constructed identically with the parts shown in FIG. 3 are designated by the same reference numerals.

Referring to FIG. 10, the bias current $I_c$ is supplied to the interior of the cooling vessel designated as 4.2K by a single line, and the bias current $I_c$ thus supplied is distributed to the SQUID sensors 10 in the cooling vessel. Further, the modulation signal is supplied to the interior of the cooling vessel via a single line, wherein the modulation signal is supplied consecutively to each of the SQUID sensors 10 by connecting the superconducting coils $L_2$ of the channels in series. The output voltage pulses of the SQUID sensors 10 are supplied to the exterior of the cooling vessel via respective output lines, and there are provided a plurality of feedback control circuits, each having a construction identical with the circuit 15, in correspondence to the plurality of channels. On the other hand, the comparator 18 for producing the reset signal is used commonly by the feedback circuits 15 of the plurality of channels, and the reset signal thus produced is supplied simultaneously to the updown counters 16 of the feedback circuits 15.

The SQUID sensor 10 of the present embodiment may include a resistor $R_3$ in series to the superconducting loop that forms an interferometer as indicated in FIG. 10, wherein the resistor $R_3$ is set substantially smaller than the resistance $R_1$ in the output line. In such a construction, one may trim the resistor $R_3$ for optimum switching characteristic. Because of the modulation applied to each of the SQUID sensors 10, the SQUID 10 causes a transition to the finite voltage state even when the magnitude of the bias current $I_c$ is substantially smaller than the threshold level of the transition as explained previously with reference to FIGS. 4(A) and 4(B). Thereby, the operational margin of the SQUID sensor 10 increases and the construction of the multichannel SQUID magnetometer becomes substantially easier. In other words, the trimming of the resistor $R_3$ is not required to be exact. The construction of FIG. 10 has another advantageous point that the number of lines connecting the interior and the exterior of the cooling vessels is substantially reduced.

Figure 11:
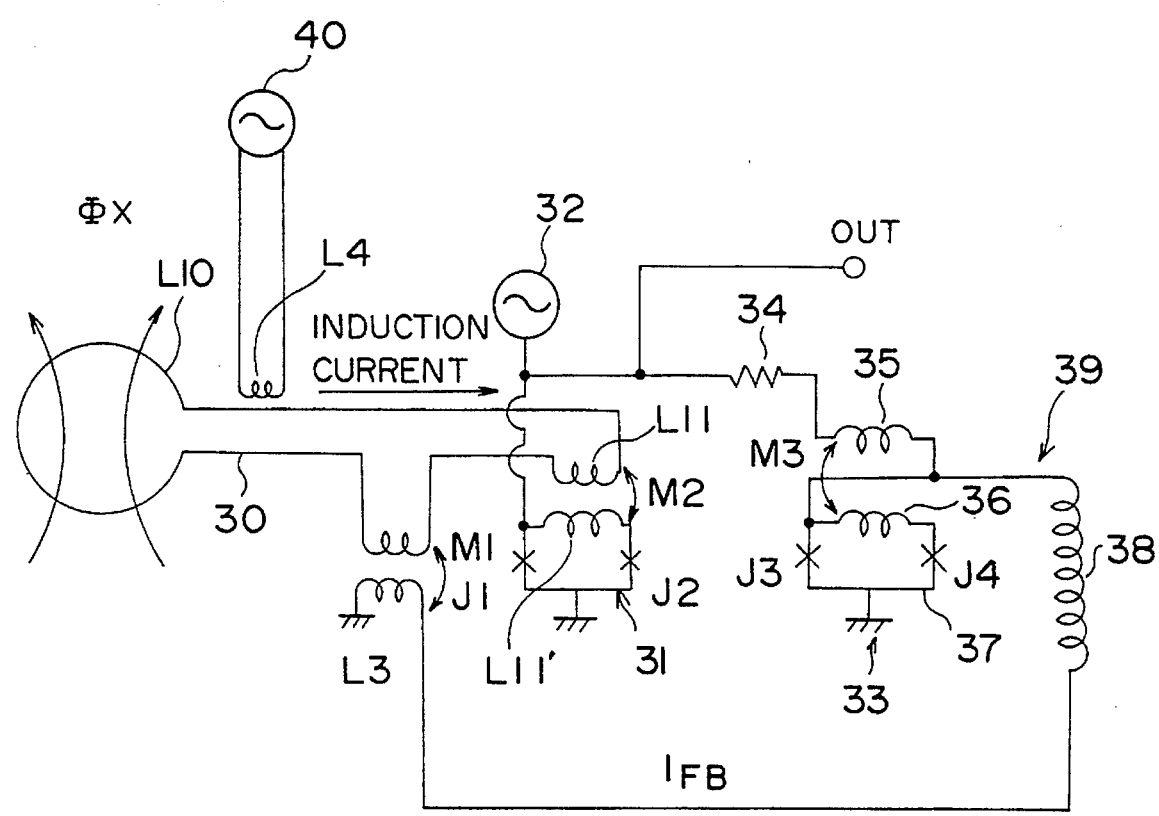
FIG. 11 is a diagram showing the construction of a single chip SQUID magnetometer according to a third embodiment of the present invention.

FIG. 11 shows another embodiment of the present invention wherein the principle of FIGS. 4(A) and 4(B) is applied to a single chip SQUID magnetometer disclosed previously by Fujimaki et al, op. cit.

Referring to FIG. 11, the magnetometer includes a superconducting pickup coil $L_{10}$ corresponding to the coil $L_0$ of FIG. 3 for detecting the external magnetic flux $\Phi_x$, and a superconducting path connects to the pickup coil $L_{10}$ to another superconducting coil $L_{11}$ that forms a closed superconducting pickup loop 30 together with the coil $L_{10}$, wherein the superconducting coil $L_{11}$ corresponds to the coil $L_1$ of FIG. 3 and establishes a magnetic coupling $M_2$ with a corresponding superconducting coil $L_{11}'$ that forms a part of a SQUID sensor 31. The SQUID sensor 31 includes a pair of Josephson junctions $J_1$ and $J_2$ forming a superconducting closed loop together with the superconducting coil $L_{11}'$ and is driven by an A.C. bias current supplied from an A.C. voltage source 32, similarly to the embodiment of FIG. 3. Thus, the SQUID 31 causes a switching from the zero voltage state to the finite voltage state and vice versa according to the characteristic diagram of FIG. 1. In response to the switching to the finite voltage state, the SQUID sensor 31 produces output voltage pulses that are supplied to an external updown counter such as the updown counter 16 provided in the room temperature environment as shown in FIG. 3, via an output terminal OUT.

The output voltage pulses of the SQUID sensor 31 are further supplied to a write gate 33 together with the A.C. bias current produced by the A.C. voltage source 32 via a resistor 34. The write gate 33 includes a superconducting coil 35 that establishes a magnetic coupling $M_3$ with another superconducting coil 36, wherein the superconducting coil 36 forms a SQUID 37 together with Josephson junctions $J_3$ and $J_4$. The SQUID 37 is connected to a superconducting coil 38 having a large inductance, and the superconducting coil 38 in turn is connected to a superconducting coil that corresponds to the coil $L_3$ of FIG. 3 and is designated as $L_3$. It should be noted that the coil $L_3$ establishes a magnetic coupling $M_1$ with the superconducting detection loop 30. The SQUID 37, the coil 38 and the coil $L_3$ are connected in series via a superconducting ground plane and forms a superconducting accumulation loop 39.

When a voltage pulse is supplied to the write gate 33 from the SQUID sensor 31, the SQUID 37 forming the write gate 33 causes a transition to the finite voltage state and a magnetic flux quantum is stored in the superconducting accumulation loop 39 in response to such a transition. The magnetic flux quanta thus stored in the loop 39 produces a perpetual current $I_{FB}$, and in response to the current $I_{FB}$, a feedback magnetic flux is produced by the superconducting coil $L_3$, wherein the feedback magnetic flux thus produced acts to cancel out the external magnetic flux $\Phi_x$ upon magnetic coupling with the superconducting detection loop 30. Thus, with increasing number of the magnetic flux quanta accumulated in the accumulation loop 38, the external magnetic flux $\Phi_x$ is canceled out gradually until the output voltage pulses are no longer produced from the SQUID sensor 31. By counting up the number of the output voltage pulses thus obtained in the external updown counter, one can detect the magnitude of the external magnetic flux $\Phi_x$. Further, the polarity of the magnetic flux $\Phi_x$ can be detected based upon the sign of the count data obtained in the updown counter.

Further, the SQUID magnetometer of FIG. 11 includes a second A.C. voltage source 40 corresponding to the A.C. voltage source 12 of the previous embodiments, wherein the A.C. voltage source 40 produces a modulation signal that swings with a speed substantially slower than the speed of the A.C. bias current produced by the A.C. voltage source 32. The modulation signal thus produced is supplied to superconducting coil $L_4$ in magnetic coupling with the superconducting detection loop 30. As a result, the operational point moves slowly to the right and to the left in the operational characteristic diagram while moving up and down at a high speed as already described with reference to FIGS. 4(A) and 4(B). Thereby, the superconducting magnetometer operates similarly to the embodiments described previously.

Further, one may connect a number of such SQUID magnetometers shown in FIG. 11 in a cooling vessel together with a superconducting multiplexing circuit to reduce the number of the lines extending from the cooling vessel. Such a construction of the multichannel SQUID magnetometer is described in the U.S. Pat. No. 5,155,434, which is incorporated herein as reference.

Further, the present invention is not limited to the embodiments described heretofore, but various variations and modifications may be made without departing from the scope of the invention.

What is claimed is:

1. A superconducting magnetometer, comprising:

a superconducting magnetic sensor for interlinking with an external magnetic flux, said superconducting magnetic sensor being supplied with a first A.C. bias current for producing output voltage pulses in response to said first A.C. bias current, said superconducting magnetic sensor having a flux versus critical current characteristic describing a relationship between a magnetic flux acting upon said superconducting magnetic sensor and said first A.C. bias current, said flux versus bias current characteristic defining a first region in which said superconducting magnetic sensor assumes a zero voltage state and a second region surrounding said first region and in which said superconducting magnetic sensor assumes a finite voltage state, said superconducting magnetic sensor producing said output voltage pulse in response to a transition from said zero voltage state to said finite voltage state;

first biasing means for supplying said first A.C. bias current with a first frequency;

feedback means supplied with said voltage pulses from said superconducting magnetic sensor for counting up the number of said voltage pulses, said feedback means further producing a feedback current in response to the number of said voltage pulses;

first superconducting magnetic coupling means coupled magnetically to said superconducting magnetic sensor, said first superconducting magnetic coupling means being supplied with said feedback current from said feedback means for producing a counter-acting magnetic flux in response to said feedback current, said superconducting magnetic coupling means coupling said counter-acting magnetic flux to said superconducting magnetic sensor;

second biasing means for producing a second A.C. bias current having a second frequency different from said first frequency; and second superconducting magnetic coupling means coupled magnetically to said superconducting magnetic sensor, said second superconducting magnetic coupling means being supplied with said second A.C. bias current from said second biasing means for producing a modulation magnetic flux in response to said second A.C. bias current, said second superconducting magnetic coupling means coupling said modulation magnetic flux to said superconducting magnetic sensor.

2. A superconducting magnetometer as claimed in claim 1, wherein said second frequency is substantially smaller than said first frequency.

3. A superconducting magnetometer as claimed in claim 2, wherein said second frequency is smaller than said first frequency by a factor of one hundred to one thousand.

4. A superconducting magnetometer as claimed in claim 1, wherein said flux versus critical current characteristic has an asymmetric shape with respect to a polarity of said magnetic flux, and wherein said first biasing means produces said first A.C. bias current without a D.C. bias offset.

5. A superconducting magnetometer as claimed in claim 1, wherein said flux versus critical current characteristic has a symmetric shape with respect to a polarity of said magnetic flux, and wherein said first biasing means produces said first A.C. bias current with a D.C. bias offset.

6. A superconducting magnetometer as claimed in claim 1, wherein said feedback means comprises an updown counter for counting said output voltage pulses as a difference between the number of positive output pulses and the number of negative output pulses.

7. A superconducting magnetometer as claimed in claim 6, wherein said updown counter is provided in a room temperature environment.

8. A superconducting magnetometer as claimed in claim 6, wherein said updown counter comprising a superconducting storage loop for storing a magnetic flux quantum in response to each output voltage pulse.

9. A superconducting magnetometer as claimed in claim 1, wherein said superconducting magnetometer comprises a superconducting coil coupled magnetically to said superconducting magnetic sensor and acting both as said first superconducting magnetic coupling means and said second superconducting magnetic coupling means, said superconducting coil superposing said feedback current and said second A.C. bias current with each other.

10. A multichannel superconducting magnetometer, comprising:

a plurality of superconducting magnetometers each comprising: a superconducting magnetic sensor for interlinking with an external magnetic flux, said superconducting magnetic sensor being supplied with a first A.C. bias current for producing output voltage pulses in response to said first A.C. bias current, said superconducting magnetic sensor having a flux versus bias current characteristic describing a relationship between a magnetic flux acting upon said superconducting magnetic sensor and said first A.C. bias current, said flux versus bias current characteristic defining a first region in which said superconducting magnetic sensor assumes a zero voltage state and a second region surrounding said first region and in which said superconducting magnetic sensor assumes a finite voltage state, said superconducting magnetic sensor producing said output voltage pulse in response to a transition from said zero voltage state to said finite voltage state; feedback means supplied with said voltage pulses from said superconducting magnetic sensor for counting up the number of said voltage pulses, said feedback means further producing a feedback current in response to the number of said voltage pulses; first superconducting magnetic coupling means coupled magnetically to said superconducting magnetic sensor, said first superconducting magnetic coupling means being supplied with said feedback current from said feedback means for producing a counter-acting magnetic flux in response to said feedback current, said superconducting magnetic coupling means coupling said counter-acting magnetic flux to said superconducting magnetic sensor; second superconducting magnetic coupling means coupled magnetically to said superconducting magnetic sensor, said second superconducting magnetic coupling means being supplied with a second A.C. bias current for producing a modulation magnetic flux in response to said second A.C. bias current, said second superconducting magnetic coupling means coupling said modulation magnetic flux to said superconducting magnetic sensor;

first biasing means for supplying said first A.C. bias current with a first frequency, said first biasing means supplying said first A.C. bias current by a single conductor line to an interior of a cooling vessel in which said superconducting magnetic sensors are held, said first biasing means further distributing said first A.C. bias current to each of said superconducting magnetic sensors; and second biasing means for producing a second A.C. bias current having a second frequency different from said first frequency, said second biasing means supplying said second A.C. bias current to the interior of said cooling vessel by a single conductor line, such that said second A.C. bias current is supplied to said plurality of superconducting magnetic sensors consecutively.

11. A superconducting magnetometer comprising:

a superconducting magnetic sensor for interlinking with an external magnetic flux, said superconducting magnetic sensor being supplied with a first A.C. bias current for producing output voltage pulses in response thereto;

first biasing means for supplying said first A.C. bias current with a first frequency;

feedback means in electrical communication with the superconducting magnetic sensor, for counting the number of said voltage pulses produced by the superconducting magnetic sensor, said feedback means outputting a feedback signal in response to the number of said voltage pulses;

first superconducting magnetic coupling means, in electrical communication with said feedback means and coupled magnetically to said superconducting magnetic sensor, for producing a counteracting magnetic flux in response thereto, said superconducting magnetic coupling means coupling said counter-acting magnetic flux to said superconducting magnetic sensor;

second biasing means for producing a second A.C. bias current having a second frequency different from said first frequency; and second superconducting magnetic coupling means, in electrical communication with said feedback means and coupled magnetically to said superconducting magnetic sensor, said second superconducting magnetic coupling means being supplied with said second A.C. bias current from said second biasing means, for producing a modulation magnetic flux in response thereto.

* * * * *

UNITED STATES PATENT AND TRADEMARK OFFICE
CERTIFICATE OF CORRECTION

PATENT NO. : 5,467,015
DATED : Nov. 14, 1995
INVENTOR(S) : GOTOH

It is certified that error appears in the above-indentified patent and that said Letters Patent is hereby corrected as shown below:

TITLE PAGE:

[56] References Cited:

OTHER PUBLICATIONS, line 1, change "noise-limied" to --noise-limited--.

Col. 2, line 4, after "1990" delete ","; and after "1992" delete ",";
line 5, change "Japanease" to --Japanese--;
line 27, change "FIG. 7" to --FIG. 1--.

Signed and Sealed this

Eleventh Day of June, 1996

Attest:

BRUCE LEHMAN

*Attesting Officer*  *Commissioner of Patents and Trademarks*